United States Patent

Punsalan et al.

(10) Patent No.: US 7,334,881 B2
(45) Date of Patent: Feb. 26, 2008

(54) METHOD AND SYSTEM TO DEPOSIT DROPS

(75) Inventors: David Punsalan, Eugene, OR (US); Peter Mardilovich, Corvallis, OR (US); Gregory Herman, Albany, OR (US); John M. Koegler, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 419 days.

(21) Appl. No.: 10/889,810

(22) Filed: Jul. 12, 2004

(65) Prior Publication Data

US 2006/0007273 A1 Jan. 12, 2006

(51) Int. Cl.
*B41J 2/085* (2006.01)
(52) U.S. Cl. ...................................... 347/76
(58) Field of Classification Search ............... 347/75, 347/76, 77, 54, 7, 15
See application file for complete search history.

(56) References Cited

U.S. PATENT DOCUMENTS

| 4,019,188 | A |   | 4/1977  | Hochbert et al. |
|-----------|---|---|---------|-----------------|
| 4,281,333 | A | * | 7/1981  | Tsuzuki et al. ............... 347/15 |
| 4,314,258 | A | * | 2/1982  | Donahue et al. ............... 347/77 |
| 5,403,617 | A |   | 4/1995  | Haaland |
| 5,725,672 | A |   | 3/1998  | Schmitt et al. |
| 6,161,911 | A | * | 12/2000 | Minemoto et al. ............. 347/7 |
| 6,251,488 | B1 |  | 6/2001  | Miller et al. |
| 6,268,584 | B1 |  | 7/2001  | Keicher et al. |
| 6,296,901 | B1 |  | 10/2001 | Boyd et al. |
| 6,349,668 | B1 |  | 2/2002  | Sun et al. |
| 6,523,928 | B2 |  | 2/2003  | Peeters et al. |
| 6,636,676 | B1 |  | 10/2003 | Renn |
| 2003/0048314 | A1 | | 3/2003 | Renn |
| 2003/0175411 | A1 | | 9/2003 | Kodas et al. |
| 2003/0180451 | A1 | | 9/2003 | Kodas et al. |
| 2003/0189167 | A1 | | 10/2003 | Schultz et al. |
| 2003/0228124 | A1 | | 12/2003 | Renn et al. |
| 2004/0013573 | A1 | | 1/2004 | Huang |
| 2004/0029033 | A1 | | 2/2004 | Boyd et al. |

FOREIGN PATENT DOCUMENTS

| EP | 0 705 699 | 4/1996 |
| EP | 0 761 445 | 3/1997 |
| JP | 61106261 | 5/1986 |

* cited by examiner

*Primary Examiner*—K. Feggins

(57) ABSTRACT

A system to deposit drops on a substrate includes a dispenser to dispense the drops, a shutter disposed between the dispenser and the substrate to focus the drops, and a screen, disposed between the dispenser and the shutter, configured to provide a charge to the drops.

65 Claims, 7 Drawing Sheets

```
                    START
                      │
                      ▼
         ┌────────────────────────────┐
         │ CREATE SAMPLE DROPLETS WITH│
         │  INKJET MATERIAL DISPENSER │
         │        (step 400)          │
         └────────────────────────────┘
                      │
                      ▼
         ┌────────────────────────────┐
         │ DEPOSIT SAMPLE DROPLET MIST│
         │   INTO MIST CONTAINMENT BOX│
         │        (step 410)          │
         └────────────────────────────┘
                      │
                      ▼
         ┌────────────────────────────┐
         │ DRAW DROPLET MIST INTO     │
         │        VENTURI             │
         │        (step 420)          │
         └────────────────────────────┘
                      │
                      ▼
         ┌────────────────────────────┐
         │    CHARGE MIST DROPLETS    │
         │        (step 430)          │
         └────────────────────────────┘
                      │
                      ▼
         ┌────────────────────────────┐
         │  ACCELERATE CHARGED DROPLETS│
         │      THROUGH VENTURI       │
         │        (step 440)          │
         └────────────────────────────┘
                      │
                      ▼
         ┌────────────────────────────┐
         │  REDUCE AVERAGE DROPLET SIZE│
         │        (step 450)          │
         └────────────────────────────┘
                      │
                      ▼
         ┌────────────────────────────┐
         │ FOCUS FINAL DROPLET SIZE   │
         │       ONTO SUBSTRATE       │
         │        (step 460)          │
         └────────────────────────────┘
                      │
                      ▼
                    END
```

Fig. 4

METHOD AND SYSTEM TO DEPOSIT DROPS

BACKGROUND

Direct write processing is one way to manufacture low-cost electronics. One process for fabricating structures used in circuits using direct write processing may involve the ejection of structure forming materials from a print head.

When performing direct write processing by ejecting material from a print head, the size of the drops ejected from the print head may affect the size of the resulting structures. Where the size of the drops ejected is large relative to the size of the features to be fabricated, formation of such structures can be difficult. Additionally, when performing direct write processing by ejecting material from a print head, the size of the drops ejected from the print head may affect the connectivity of the resulting structures or traces.

BRIEF DESCRIPTION OF THE DRAWINGS

The accompanying drawings illustrate various embodiments of the present method and system and are a part of the specification. The illustrated embodiments are merely examples of the present system and method and do not limit the scope thereof.

FIG. 4 is a flow chart illustrating an exemplary method for performing deposition using the printing system of FIG. 2, according to one exemplary embodiment.

Throughout the drawings, identical reference numbers designate similar, but possibly different, elements.

DETAILED DESCRIPTION

A number of exemplary methods and an apparatuses for using a dispenser, such as an inkjet material dispenser, to deposit material according to a deposition method are described herein. More specifically, the present method and apparatus is configured to fabricate lines or dots as small as 1 micron or smaller by initially creating droplets with an inkjet material dispenser, depositing the droplets into a mist containment structure, charging the droplets, accelerating the droplets through a venturi, and focusing the final droplets onto selected areas of a substrate. Additionally, the drop size may be filtered according to size prior to being focused onto the substrate. A detailed explanation of the components and functions of the present apparatus will be given hereafter.

As used in the present specification and the appended claims, the term "potential" is meant to be understood broadly as referring to a difference in an electrical charge, expressed in volts, between two points in a circuit.

In the following description, for purposes of explanation, numerous specific details are set forth in order to provide a thorough understanding of the present system and method for using an inkjet material dispenser to perform material dispensing. It will be apparent, however, to one skilled in the art that the present method may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification may be referring to different embodiments.

Exemplary Structure

Figure 1:
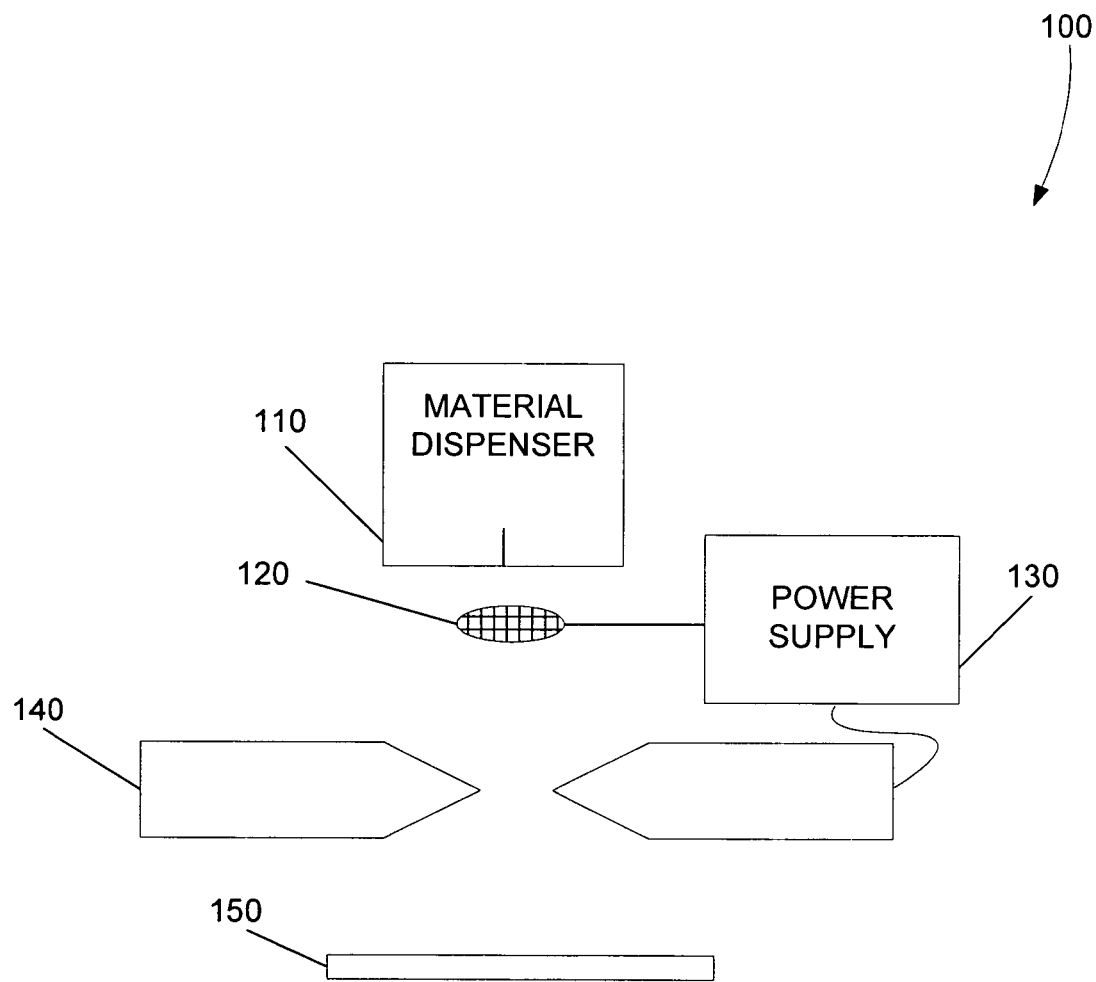
FIG. 1 is a simple block diagram illustrating a material printing system, according to one exemplary embodiment.

FIG. 1 illustrates a first exemplary embodiment of a printing system (100) that may be used to perform material deposition in ranges as low as the zeptoliter range. A zeptoliter is equal to $1\times10^{-21}$ liters. As illustrated in FIG. 1, the first exemplary printing system (100) includes a material dispenser (110) disposed adjacent to a material receiving substrate (150). FIG. 1 also illustrates a conductive screen (120) disposed between the material dispenser (110) and the material receiving substrate (150). As illustrated, the conductive screen is coupled to a power supply (130). Additionally, a shutter (140) that is coupled to the power supply (130) is disposed between the conductive screen (120) and the material receiving substrate (150).

According to the first exemplary embodiment illustrated in FIG. 1, the conductive screen (120) that is electrically coupled to a power supply (130) is positioned adjacent to the material dispenser (110) to impart a negative charge on droplets emitted by the material dispenser. More specifically, according to one exemplary embodiment, a voltage may be applied to the electrically conductive screen (120) by the power supply (130). As material droplets are dispensed by the material dispenser (110), a negative charge may be induced to the material droplets by the conductive screen (120).

Adjacent to the conductive screen (120) is a shutter (140). According to one exemplary embodiment, the shutter (140) acts as a filter to reduce the average size of the droplets allowed to pass. According to one exemplary embodiment, the shutter (140) includes a pair of electrodes producing a positive field in the trajectory path of the negatively charged droplets. Due to the negative charge imposed upon the droplets by the conductive screen (120), relatively small droplets are more likely to be allowed to pass the positive electric field produced by the shutter (140). The larger droplets will likely be attracted to the positive electric field and will not be allowed to continue towards the substrate (150). Additionally, the shutter (140) may be configured to focus the material droplet towards the material receiving substrate (150), as will be explained in further detail below with reference to FIG. 2.

Figure 2:
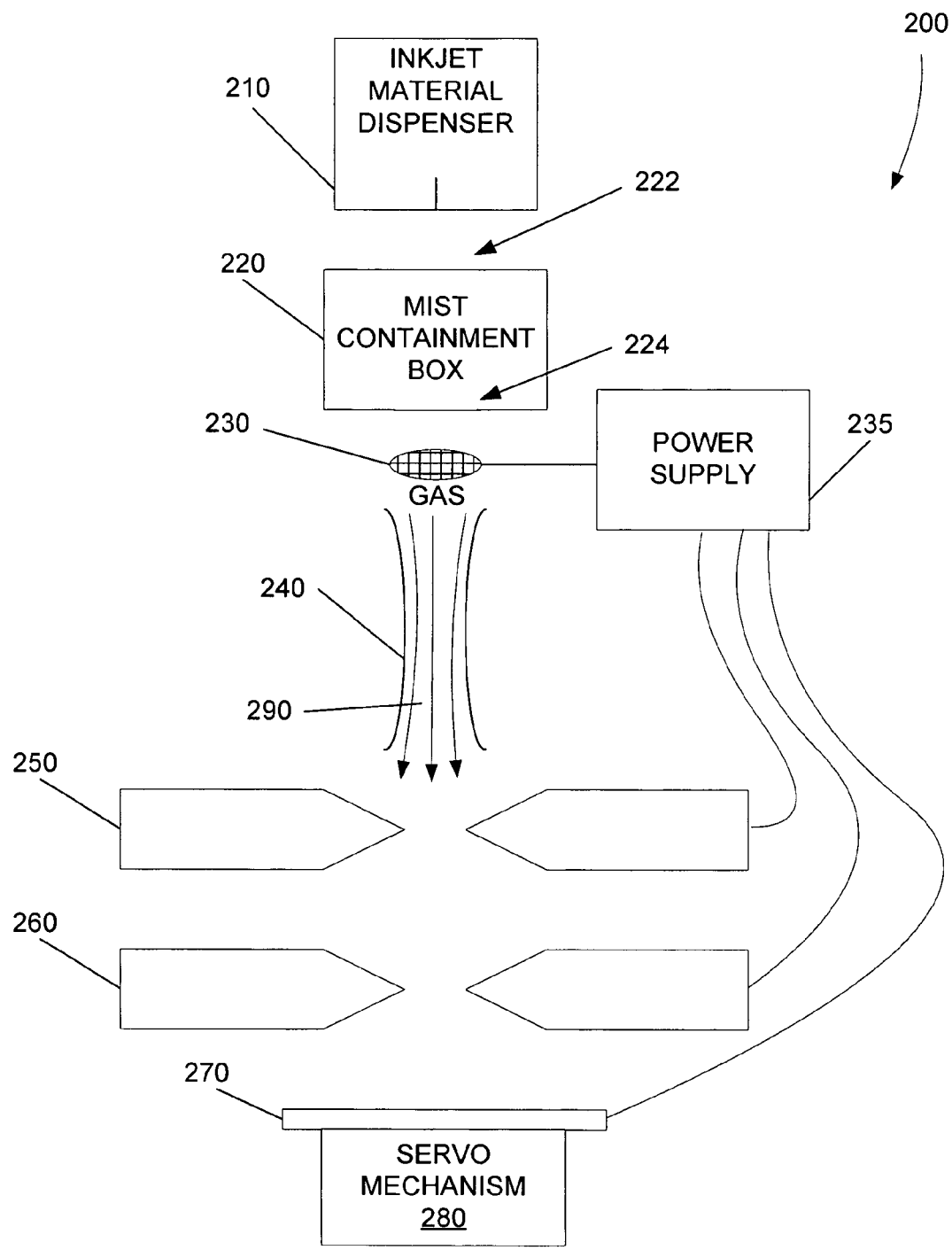
FIG. 2 is simple block diagram illustrating a drop printing system, according to one exemplary embodiment.

FIG. 2 illustrates a second exemplary embodiment of a printing system (200) that may be used to perform material deposition in ranges as low as the zeptoliter range. As illustrated in FIG. 2, the second exemplary printing system (200) includes an embodiment of a dispenser, such as inkjet material dispenser (210), disposed adjacent to a mist containment box (220). As illustrated, the mist containment box (220) has both an entrance (222) and an exit (224) orifice. A conductive screen (230) electrically coupled to a power supply (235) is disposed adjacent to the exit orifice (224) of the mist containment box (220). Continuing from the exit orifice (224), a venturi (240) is disposed adjacent to the conductive screen (230) and leads to a first (250) and second (260) shutter en route to a material receiving substrate (270). The independent components of the present high resolution printing system (200) will now be discussed in further detail below.

Figure 3:
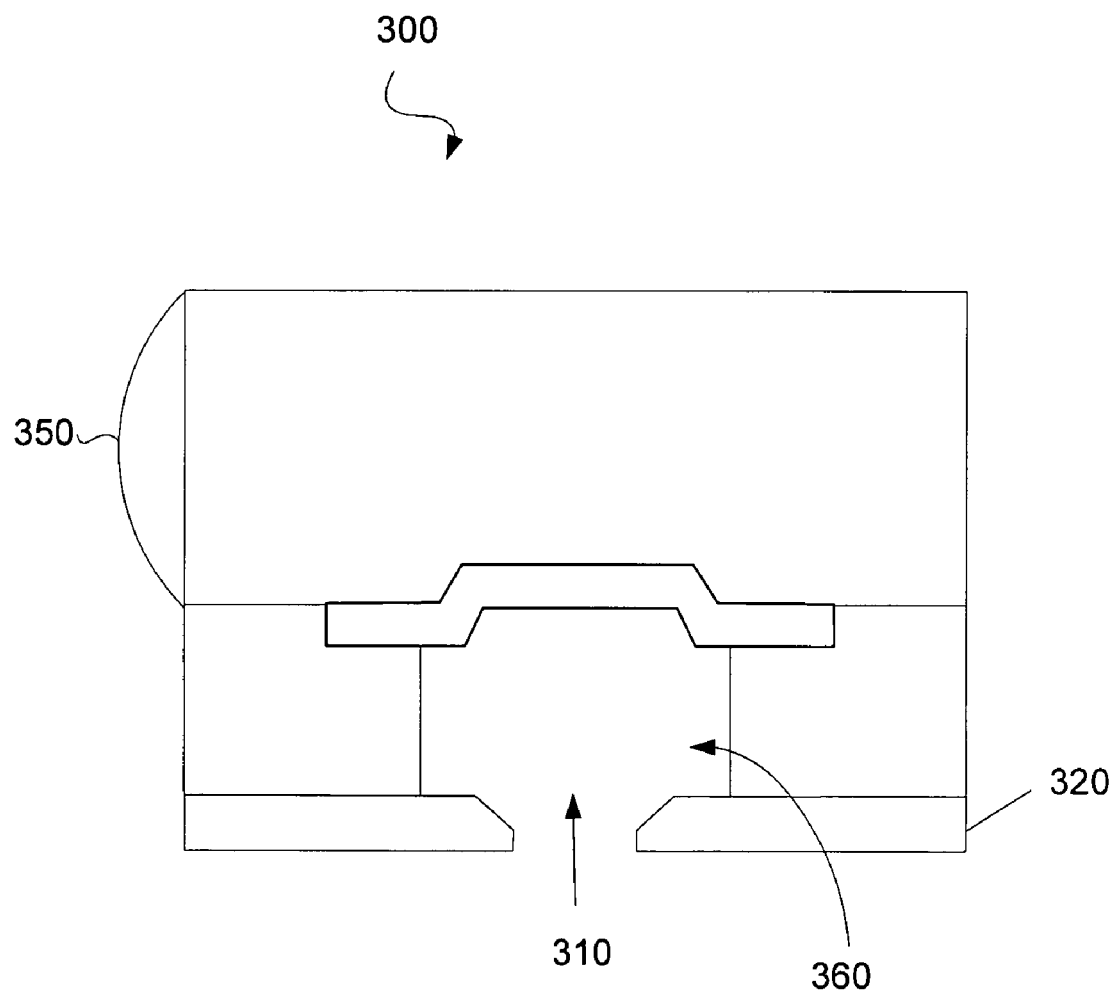
FIG. 3 is a cross-sectional view of a thermal-inkjet print head, according to one exemplary embodiment.
Figure 5:
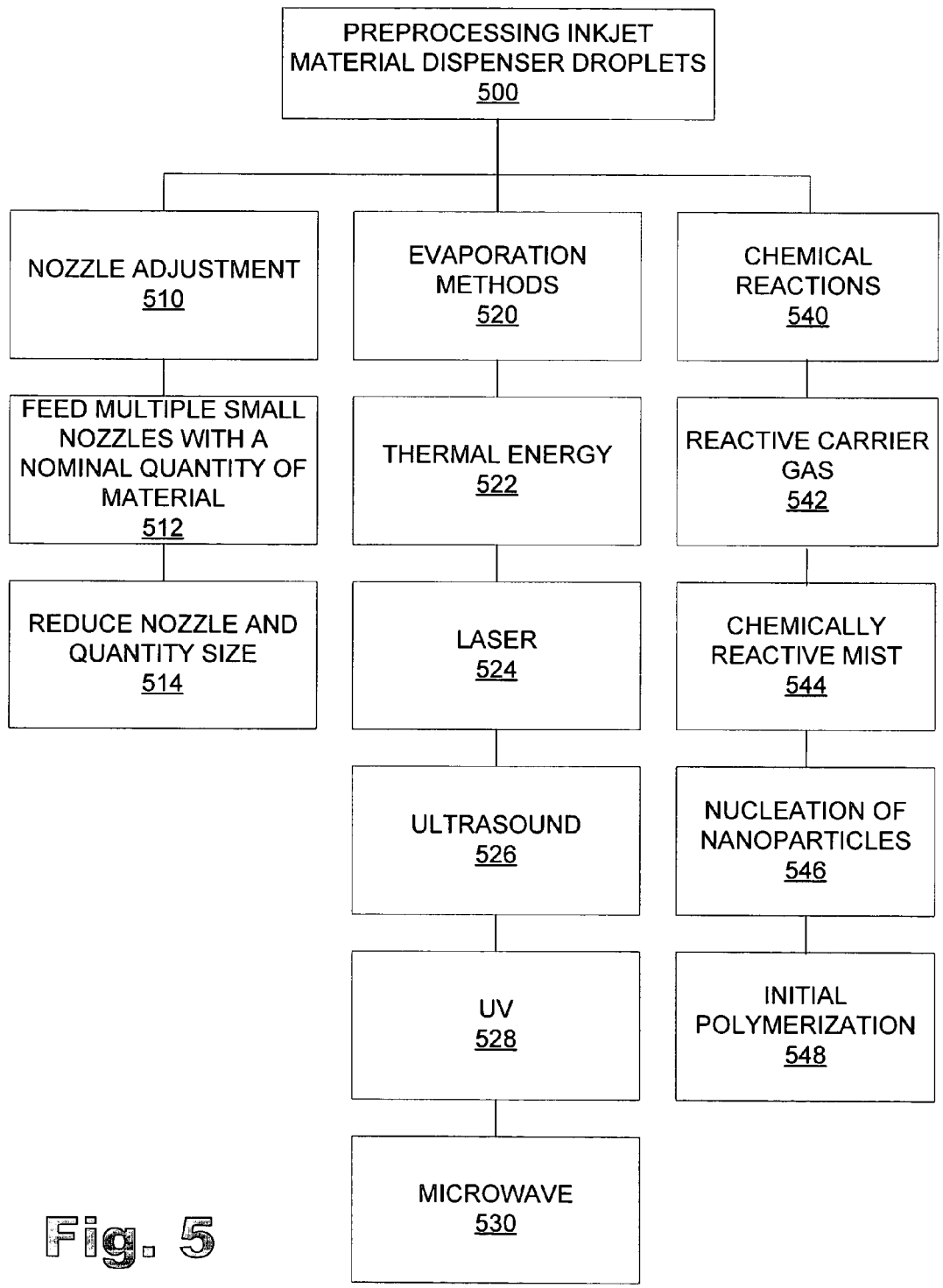
FIG. 5 is a flow chart illustrating a number of exemplary material preprocessing methods, according to one exemplary embodiment.

According to one exemplary embodiment, the inkjet material dispenser (210) is a thermal inkjet material dispenser similar to the one illustrated in FIG. 3. As shown in FIG. 3, the thermal inkjet material dispenser (300) includes a base portion (350), a chamber portion (360) and an orifice plate portion (320). Additionally, a nozzle (310) is formed in the orifice plate (320) to permit the escape of dispensed material.

As discussed above, the thermal inkjet material dispenser (300) may be configured to function as a material deposition source by selectively dispensing a desired material. Accordingly, the thermal inkjet architecture, the drive waveform produced by the thermal inkjet, the pulse spacing of the thermal inkjet, and/or the material properties of the sample material may be adjusted to produce substantially uniform material droplets in the form of a mist. According to one exemplary embodiment, a fine drop mist may be formed with a thermal inkjet material dispenser (300) by reducing the size of the nozzle (310) employed. According to this exemplary embodiment, the drop sizes of the material emitted from the reduced nozzle (310) may be 2-3 orders of magnitude, or more, smaller than the nominal size of material droplets emitted. Additionally, even smaller droplet magnitudes are conceivable by further varying the thermal inkjet material dispenser (300).

In addition to producing uniform drop sizes, the use of an inkjet material dispenser allows for a desirable level of the material production frequency. According to one exemplary embodiment, the present printing system (200; FIG. 2) incorporating an inkjet material dispenser (210; FIG. 2) is capable of producing material at a rate of up to and beyond 1 kHz. The above exemplary embodiment describes a range of frequencies and drop volumes for illustrative purposes only and the results may be altered by varying a number of factors including, but in no way limited to, sample density and thermal inkjet material dispenser properties. Moreover, while the present exemplary embodiment is described in the context of implementing a thermal inkjet material dispenser (300) to produce the fine drop mist, any number of dispensers may be used including, but in no way limited to, thermally activated inkjet material dispensers, mechanically activated inkjet material dispensers, electrically activated inkjet material dispensers, magnetically activated material dispensers, and/or piezoelectrically activated material dispensers.

Returning again to FIG. 2, once the inkjet material dispenser (210) has produced a fine drop mist of a desired material, the mist may be contained within a mist containment box (220). The mist containment box (220), configured to receive the generated material mist, may be any substantially sealed containment volume of any number of shapes, configured to receive the drop mist and temporarily house the mist at substantially atmospheric pressure. Additionally, the mist containment box (220) may be heated to further reduce the mist drop size through evaporation. Moreover, as mentioned previously, the mist containment box (220) includes an entrance (222) and an exit (224) configured to further facilitate the reception and deposition of desired material droplets.

A conductive screen (230) electrically coupled to a power supply (235) is positioned adjacent to the exit (224) of the mist containment box (220). According to one exemplary embodiment, illustrated in FIG. 2, the electrically conductive screen (230) is an arrangement of wires or other conductive structures or materials to which an electric potential may be applied. According to one exemplary embodiment, the electrically conductive grid (230) is formed of 316 stainless steel. The electrically conductive screen (230) is configured to allow any sample source exiting the mist containment box (220) to pass there through. According to one exemplary embodiment, the distance separating the mist containment box (220) and the electrically conductive screen (230) is in the order of a few centimeters (cm). During operation, a voltage is applied to the electrically conductive grid (230) by the power supply (235). As the mist droplets escape the mist containment box (220) a negative charge may be induced thereto by the conductive screen (230).

Immediately adjacent to the conductive screen (230) is a venturi (240). A venturi (240) is a tube with a smoothly varying constriction forming a throat in the middle thereof. Due to the varying constriction of the venturi (240), as a fluid or gas is passed therethrongh, it experiences changes in velocity and pressure, as described by Bernoulli's principle. According to one exemplary embodiment, as a gas (290) of suitabie velocity is passed through the venturi (240), the velocity will increase and the pressure in the venturi will be reduced below atmospheric pressure, thereby drawing in mist droplets from the mist containment box (220). As the mist droplets are drawn into the gas stream (290), they are accelerated with the gas until they exit the venturi (240).

Adjacent to the venturi (240) is a first (250) and a second (260) shutter. According to one exemplary embodiment, the first shutter (250) acts as a filter to further reduce the average size of the droplets allowed to pass. According to the exemplary embodiment illustrated in FIG. 2, the first shutter (250) includes a pair of electrodes producing a positive field in the trajectory path of the negatively charged mist. Due to the negative charge imposed upon the droplets by the conductive screen (230), relatively small droplets are more likely to be allowed to pass the positive electric field produced by the first shutter (250). The larger droplets will likely be attracted to the positive electric field and will not be allowed to continue towards the substrate (270). Additionally, the positive field generated by the first shutter (250) may be varied to vary the size of the negatively charged droplets allowed therethrough. The voltage applied by the first shutter (250) is inversely proportional to the drop diameter, and subsequently negative charge, that will be allowed through. Additionally, according to one exemplary embodiment, the electric field generated by the first shutter (250) could be time varying with a time equal to or smaller than the transit time of drops passing through the shutters, thereby creating a pulse effect.

Similarly, the second shutter (260) is configured to focus the final droplet size used for printing. According to this exemplary embodiment, the second shutter (260) includes a pair of electrodes configured to receive a variable positive charge from a voltage source, thereby focusing and positionally directing the material droplets onto the substrate (270). Accordingly, the second shutter may be made of any conductive material including, but in no way limited to, stainless steel.

The substrate (270) used in the present system and method, may be any surface configured to receive a printed material including, but in no way limited to, a circuit board, a touch screen, a backplane, or a radio frequency identification label. Moreover, as illustrated in FIG. 2, a servo mechanism (280) may be coupled to the substrate (270) to selectively position the substrate for the reception of a desired material. The servo mechanism (280) may include any number of gears, belts, pulleys, motors, or chains configured to precisely and selectivley position the substrate (270). Alternatively, the servo mechansim (280) may be coupled to the printing system (200) to selectively position the system over a stationary substrate (270).

Exemplary Implementation and Operation

FIG. 4 is a flow chart illustrating an exemplary method for using the printing system (200) illustrated in FIG. 2. As illustrated in FIG. 4, the present method begins by creating a mist of sample material droplets with an inkjet material dispenser (step 400). Once the droplets are generated, the sample droplet mist is deposited into a mist containment box (step 410) until they are drawn into a venturi (step 420). As the sample droplet mist is being drawn into the venturi from the mist containment box (step 420), the material mist droplets are given a charge (step 430) and accelerated through the venturi (step 440). Once the charged mist droplets exit the venturi, the average drop size is reduced (step 450) and they are selectively focused onto a substrate (step 460). The individual steps of the above-mentioned method will now be described in further detail below.

As illustrated in FIG. 4, the present exemplary method begins by generating a mist of sample droplets with an inkjet material dispenser (step 400). The "mist" of sample droplets can be formed from an inkjet material dispenser by performing one or more material dispenser pre-processing methods. As illustrated in FIG. 5, pre-processing methods that may be performed on a generated mist include, but are in no way limited to, performing a nozzle adjustment (510), performing evaporation methods (520), and/or performing chemical reactions (540) during or after the mist generation process.

According to one exemplary embodiment, the nozzle adjustment (510) that may be performed on the present inkjet material dispenser (210; FIG. 2) includes, but is in no way limited to, feeding multiple nozzles with a nominal quantity of material (512) or reduce both the nozzle and material quantity sizes (514). According to one exemplary embodiment, the performance of one or more of the above-mentioned nozzle adjustments (510) will achieve a material drop size that is two to three orders of magnitude smaller than nominal inkjet material drop sizes.

Additionally, as illustrated in FIG. 5, a number of evaporation methods may be performed on the generated mist droplets to further reduce their volume. Accordingly, a partial evaporation of a diluted solution, by passing the generated mist through an area with an elevated temperature, will reduce its volume. If an evaporation stage is implemented by the present system and method, the elevated-temperature area should be long enough to allow the partial evaporation of the mist droplets. By way of example only, if a 6 picoliter drop containing 98% solvent is passed through a hot zone of 5 millimeters or longer, the temperature may be adjusted to give 90% evaporation, resulting in a final drop dimension of approximately 0.6 picoliters. As illustrated in FIG. 5, the hot zone may be generated by the application of any number of energy sources including, but in no way limited to, thermal energy (522), a laser (524), ultrasound radiation (526), ultraviolet radiation (528), or microwave radiation (530).

Additionally, as illustrated in FIG. 5, a number of chemical reactions may be performed on the generated mist droplets to further modify their size or other desirable attributes. The chemical reactions performed on the generated mist droplets can be made possible by including a reactive carrier gas (542), including an additional chemical reactive mist (544), initiating a nucleation of nanodroplets (546), and/or initiating polymerization (548).

Once the mist droplets are generated and/or pre-processed, the mist droplets are deposited in a mist containment box (step 410; FIG. 4). The mist droplets may be directly dispensed into the mist containment box (220) by the inkjet material dispenser (210), or the mist droplets may be drawn into the mist containment box by a gas flowing at a suitable velocity. As illustrated in FIG. 6, the mist containment box (220) may receive the dispensed droplets (600) and store them in the mist containment box (220) as a contained mist (610). The mist containment box (220) may be any contained volume, regardless of its cross-sectional profile. Additionally, the mist containment box (220) may be heated, according to one exemplary embodiment, to maintain the mist droplets in their mist form and reduce condensation.

In conjunction with the storage of the contained mist (610) within the mist containment box (220), a gas of suitable velocity is passed through the venturi (240) causing a low pressure in the venturi. As a result of the lower pressure in the venturi (240), a pressure differential between the atmospheric pressure of the mist containment box (220) and the lower pressure of the venturi exists. As a result, the contained mist (610) is drawn out of the mist containment box (220) toward the lower pressure of the venturi (240).

As the contained mist (610) exits the mist containment box (220), it is passed through the conductive screen (230) coupled to a power supply (235). As the mist is passed through the conductive screen (230), a negative electrostatic charge is applied to the mist, according to one exemplary embodiment. Alternatively, a positive charge may be applied to the mist droplets.

Regardless of the charge of the mist, it is subsequently caught up in the gas (620) that is flowing through the venturi (240). Consequently, the charged mist droplets also flow through the venturi (240) towards the first shutter (250). According to one exemplary embodiment, the carrier gas is an inert gas. Alternatively, the carrier gas may be reactive, such as an oxidizing (O2) carrier gas or a reducing (H2) agent configured to initiate a chemical reaction (540; FIG. 5) on the mist.

Additionally, the carrier gas and the charged mist droplets (630) may be accelerated through the venturi (240) by an electrical potential between the conductive screen (230) and an additional electrode. According to this exemplary embodiment, the additional electrode forming an accelerating potential may include, but is in no way limited to, one or more of the shutters (250, 260) or the material receiving substrate (270). The velocity and acceleration of the mist droplets may be controlled by varying the electrical potential. For fluids which benefit from mixing of the droplets, the electrical potential, and consequently the velocity can be reduced to promote contact/mixing of the droplets.

As the charged droplets (630) exit the venturi (240), they are directed towards a first shutter (250). As noted above, the first shutter is configured to reduce the size of the charged droplets that are allowed to pass. According to one exemplary embodiment, the first shutter includes a plurality of positively charged electrodes. According to this exemplary embodiment, the positive charge placed on the electrodes of the first shutter (250) controls the size of the negatively charged drop allowed to pass. Due to the negative charge imposed upon the droplets by the conductive screen (230), primarily relatively small droplets will be allowed to pass the positive electric field produced by the first shutter (250).

The larger droplets will frequently be attracted to the positive electric field and will usually not be allowed to continue towards the substrate (270). Additionally, the positive field generated by the first shutter (250) may be varied to vary the average size of the negatively charged droplets allowed therethrough. The voltage applied by the first shutter (250) is inversely proportional to the desired drop diameter, and subsequently the negative charge that will be allowed through. It should be kept in mind, however, that the drop size which is initially generated by the present system and method may be very different from the drop size which is actually deposited. This is achieved by size selection (e.g. by means of filtration) and also by size reduction (e.g. solvent evaporation during in-flight processing of droplets.)

Alternatively, the first shutter may be any mechanism for reducing the droplet size allowed to pass there through. According to one alternative embodiment, the first shutter (250) includes, but is in no way limited to, a size reducing filter, an electric field, a size reducing membrane, and the like.

The second shutter (260) of the exemplary printing system focuses the final droplet size used for printing so that it may be selectively and accurately deposited on the substrate (270). According to one exemplary embodiment, both of the shutters (250, 260) control the droplet size by the amount of positive voltage applied. The larger the voltage, the smaller the average drop diameter will be allowed through. Additionally, the positive voltage applied to the second shutter (260) may be varied to direct the final deposition charged droplets (640) towards the substrate (270). According to one exemplary embodiment, the electrodes of the second shutter (260) are more closely spaced than the electrodes of one exemplary embodiment of the first shutter (250) to aid in the focusing of the final deposition charged droplets (640) and to increase the resolution of the resulting deposition.

Figure 6:
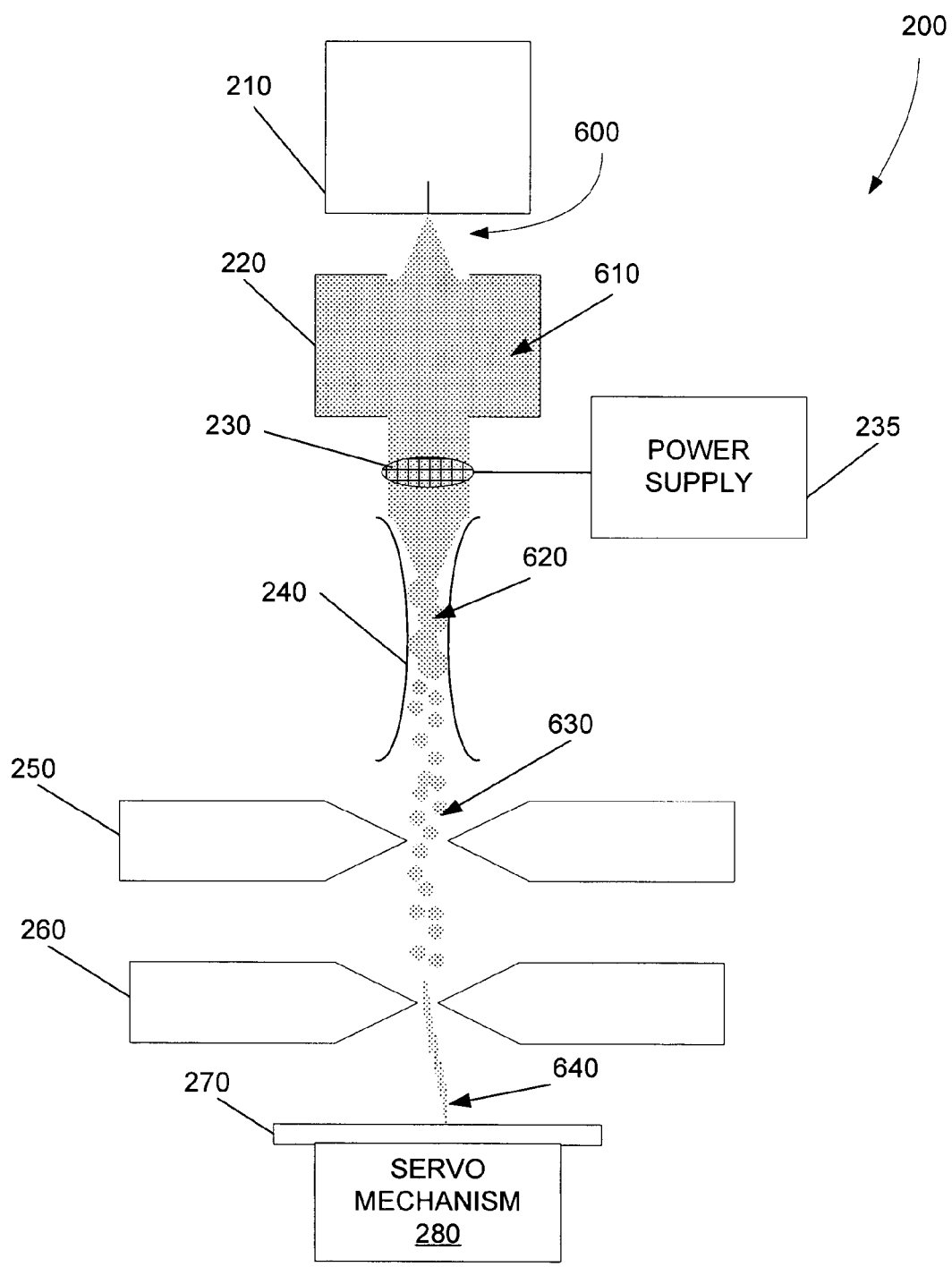
FIG. 6 is a system diagram illustrating an embodiment of a printing system depositing a desired material, according to one exemplary embodiment.

Moreover, the selective deposition of the present final deposition charged droplets (640) may be facilitated by the servo mechanism (280) coupled to the present printing system (200). As illustrated in FIG. 6, the servo mechanism (280) may be configured to selectively translate the substrate (270), thereby varying the placement of the final deposition charged droplets (640). According to one exemplary embodiment, the servo mechanism (280) may be selectively controlled by a computing device (not shown) communicatively coupled thereto. Alternatively, the servo mechanism (280) may be coupled to the printing system (200) to selectively position the printing system (200) over a stationary substrate (270). Once deposited on the substrate (270), the charged droplets may adhere to the substrate (270) through mechanical adhesion and evaporation of a solvent carrier.

Figure 7:
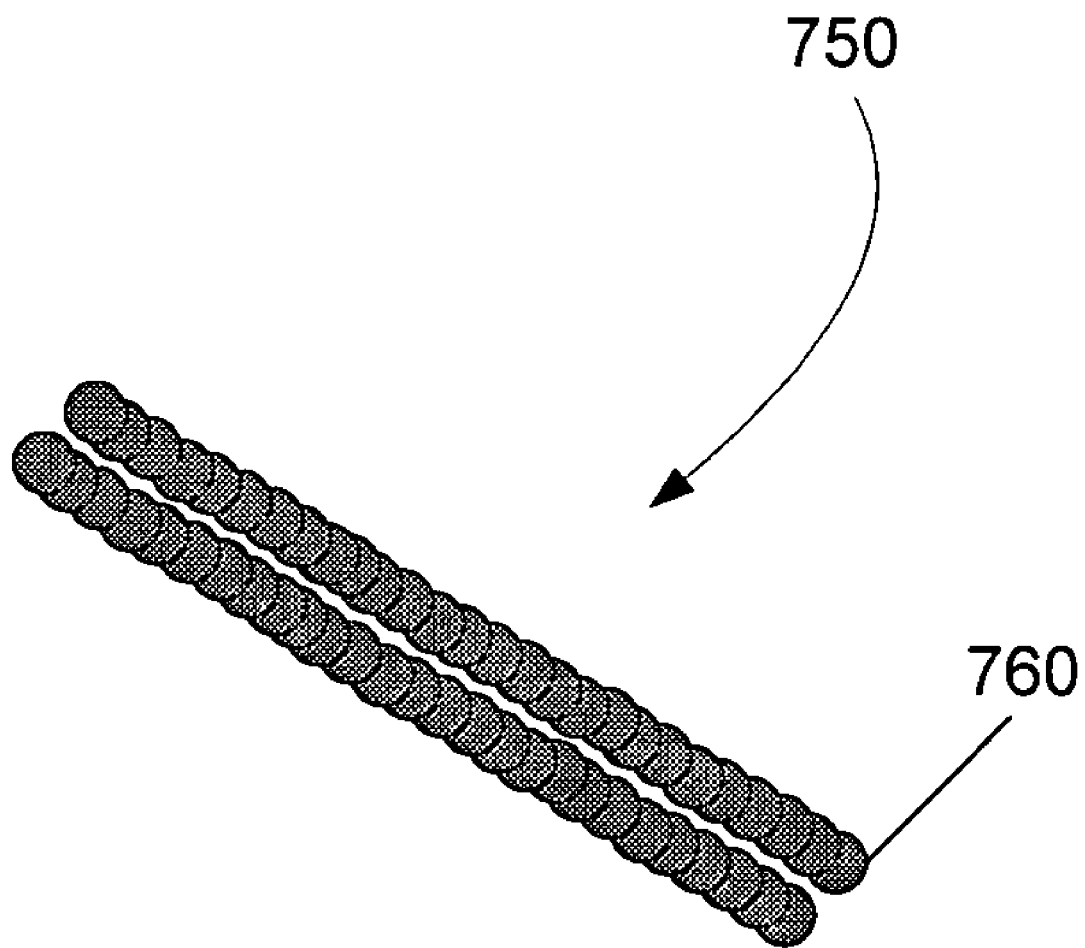
FIG. 7 is a top view illustrating the spatial resolution of an embodiment of the present printing method, according to one exemplary embodiment.

In general, the larger the drop ejected, the more likely the solid content of the drop will collect along the edges of the drop, thereby decreasing the connectivity of adjacent drops. Using the illustrated system and methods, a resolution of 1 micrometer lines and or 1 micrometer dots may be produced. As illustrated in FIG. 7, the increased resolution of the resulting depositions, when depositing electronic materials, increases the connectivity of the resulting deposition. As illustrated in FIG. 7, the present deposition (750) includes relatively small droplets (760) exhibiting enhanced film uniformity. Consequently, there is an increased connectivity of the deposition (750) because with the relatively smaller droplets the collection of the solid content included in the deposited fluid near the edges of the drop would be less distance from the center of the area onto which the drop is deposited than would be the case with relatively larger drops.

Additionally, the incorporation of an inkjet material dispenser as a mist generator allows for the generation of the droplets (760) at a desired frequency. According to one exemplary embodiment, the droplets (760) may be generated at frequencies of up to 1 KHz.

Moreover, the present system and method allow for the mist droplets to be transported in either a carrier gas or an electric field. According to the present system and method, the carrier gas and/or the electric field strength can be modified to vary the reaction experienced by the mist droplets. In the case of reactive mist droplets, duration of in-flight processing can be tuned to allow reaction between droplets. Additionally, in the case of a reactive carrier gas, the mist droplets may be oxidized for oxides or reduced for metals.

Alternative Embodiments

According to one alternative embodiment, a focused laser beam or ultraviolet (UV) beam may be used to increase adhesion of the deposited/printed mist droplets. As noted above, with reference to FIG. 5, laser and UV beams may be used to evaporate the above-mentioned mist droplets. According to one exemplary embodiment, a UV or a laser beam may be directed towards the desired substrate (270; FIG. 6) immediately preceding, or in conjunction with the deposition of the deposited mist droplets. Accordingly, the deposited mist droplets can be deposited on a molten puddle formed on the desired substrate. Consequently, a number of previously unconsidered materials, such as ceramics, may be deposited by the present system and method.

In conclusion, the present system and method allow for the printing of a desired deposition material by incorporating an inkjet material dispenser. More specifically, the present system and method is configured to fabricate features of 1 micron or smaller by initially creating material sample droplets with an inkjet material dispenser, depositing the mist droplets into a mist containment structure, charging the droplets, accelerating the droplets through a venturi, and focusing the final droplets onto selected areas of a substrate. Additionally, the drop size may be further filtered prior to being focused onto the substrate.

The preceding description has been presented only to illustrate and describe exemplary embodiments of the present system and method. It is not intended to be exhaustive or to limit the present system and method to any precise form disclosed. Many modifications and variations are possible in light of the above teaching. It is intended that the scope of the present system and method be defined by the following claims.

What is claimed is:

1. A system to deposit drops on a substrate comprising:
- a dispenser to dispense said drops;
- a shutter disposed between said dispenser and said substrate to reduce a size of said drops; and
- a screen, disposed between said dispenser and said shutter, configured to provide a charge to said drops.

2. The system of claim 1, wherein said dispenser comprises an inkjet dispenser.

3. The system of claim 2, wherein said inkjet dispenser comprises one of a thermally activated inkjet material dispenser, a mechanically activated inkjet material dispenser, an electrically activated inkjet material dispenser, a magnetically activated material dispenser, or a piezoelectrically activated inkjet material dispenser.

4. The system of claim 1, wherein said drops comprise between 1 picoliter and 1 zeptoliter.

5. The system of claim 1, wherein said drops comprise:
a solvent; and
a conductive material dispersed within said solvent.

6. The system of claim 1, wherein said substrate comprises one of a circuit board, a touch screen, a backplane, or a radio frequency identification label.

7. The system of claim 1, further comprising a second shutter disposed between said shutter and said dispenser, said second shutter configured to focus said drops onto said substrate.

8. The system of claim 7, wherein said substrate or said second shutter is configured to operate as an electrode to produce a potential between said screen and said electrode, said potential selected to accelerate said drops toward said substrate.

9. The system of claim 7, wherein said second shutter comprises a plurality of electrodes configured to focus said drops by varying a voltage on said plurality of electrodes.

10. The system of claim 1, wherein said shutter comprises:
a plurality of electrodes;
said plurality of electrodes being configured to affect passage of said drops based on a size of said drops.

11. The system of claim 10, wherein said plurality of electrodes is configured to affect passage of said drops by varying a voltage on said plurality of electrodes.

12. The system of claim 1, wherein said shutter comprises one of a membrane or a filter configured to reduce a size of said drops.

13. The system of claim 1, further comprising a power supply coupled to said screen.

14. The system of claim 13, wherein said screen comprises a conductive stainless steel screen.

15. The system of claim 1, further comprising:
a servo mechanism configured to position said substrate; and
a computing device communicatively coupled to said servo mechanism.

16. The system of claim 15, wherein said servo mechanism is coupled to said substrate.

17. The system of claim 1, wherein said shutter is configured to operate as an electrode;
wherein said electrode is configured to produce a potential between said screen and said electrode, said potential selected to accelerate, said drops towards said substrate.

18. The system of claim 1, wherein said shutter generates an electric field to that varies with time so as to pass pulses of said drops of a reduced size.

19. The system claim 1, further comprising a hot zone trough which said drops pass, said hot zone causing evaporation of a solvent of said drops.

20. The system of claim 1, further comprising an emitter of an energy beam directed at said substrate to selectively heat a portion of said substrate receiving said drops.

21. A system to deposit drops on a substrate comprising:
a dispenser to dispense said drops;
a shutter disposed between said dispenser and said substrate;
a screen, disposed between said dispenser and said shutter, configured to provide a charge to said drops; and
a mist containment box disposed between said dispenser and said screen;
said mist containment box being configured to house said drops at atmospheric pressure.

22. A system to deposit drops on a substrate comprising:
a dispenser to dispense said drops;
a shutter disposed between said dispenser and said substrate;
a screen, disposed between said dispenser and said shutter, configured to provide a charge to said drops; and
a venturi disposed between said screen and said shutter, said venturi being configured to receive a carrier gas flow.

23. The system of claim 22, wherein said carrier gas flow comprises one of an inert gas, an oxidizing gas, or a reducing gas.

24. A system for forming an electronic component on a substrate, comprising:
a material dispenser configured to dispense a mist of material droplets;
a mist containment box disposed between said substrate and said material dispenser configured to house said mist of material droplets at atmospheric pressure;
a conductive screen coupled to a power supply, said conductive screen being disposed between said mist containment box and said substrate, said conductive screen being configured to provide an electrostatic charge to said material droplets;
a venturi disposed between said conductive screen and said substrate;
a size reducing shutter disposed between said venturi and said substrate; and
a focusing shutter disposed between said size reducing shutter and said substrate.

25. The system of claim 24, wherein said material dispenser comprises one of a thermally activated inkjet material dispenser, a mechanically activated inkjet material dispenser, an electrically activated inkjet material dispenser, a magnetically activated material dispenser, or a piezoelectrically activated inkjet material dispenser.

26. The system of claim 24, wherein said material droplets comprise between 1 picoliter and 1 zeptoliter.

27. The system of claim 24, wherein said electronic component comprises one of a circuit board, a touch screen, a backplane, or a radio frequency identification label.

28. The system of claim 24, wherein said size reducing shutter comprises:
a plurality of electrodes;
said plurality of electrodes being configured to affect passage of said material droplets based on a size of said material droplets.

29. The system of claim 28, wherein said plurality of electrodes is configured to affect passage of said material droplets by varying a voltage on said plurality of electrodes.

30. The system of claim 24, wherein said size reducing shutter comprises one of a membrane or a filter configured to reduce a size of said material droplets.

31. The system of claim 24, wherein said focusing shutter comprises a plurality of electrodes configured to focus said material droplets by varying a voltage on said plurality of electrodes.

32. The system of claim 24, wherein said conductive screen comprises a stainless steel screen.

33. The system of claim 24, further comprising a servo mechanism coupled to said system;
said servo mechanism further being communicatively coupled to a computing device.

34. The system of claim 24, wherein said size reducing shutter, said focusing shutter, or said substrate is configured to act as a an electrode;

wherein said electrode is configured to produce a potential between said conductive screen and said electrode, said potential being configured to accelerate said mist of material droplets towards said substrate.

35. A system for depositing drops on a substrate comprising:
a dispenser configured to dispense drops;
a means for reducing a size of said drops after said drops have been dispensed; and
a means for applying a charge to said drops.

36. The system of claim 35, wherein said dispenser is configured to dispense a mist of material droplets.

37. The system of claim 35, wherein said substrate is disposed adjacent to said dispenser; and
said system further comprises means for focusing said drops disposed between said dispenser and said substrate; and
said means for applying a charge to said drops is disposed between said dispenser and said means for focusing said drops.

38. The system of claim 37, wherein said means for reducing a size of said drops is disposed prior to said means for focusing of said drops.

39. The system of claim 35, wherein said dispenser comprises one of a thermally activated inkjet material dispenser, a mechanically activated inkjet material dispenser, an electrically activated inkjet material dispenser, a magnetically activated material dispenser, or a piezoelectrically activated inkjet material dispenser.

40. The system of claim 35, wherein said drops comprise between 1 picoliter and 1 zeptoliter.

41. The system of claim 35, wherein said substrate comprises one of a circuit board, a touch screen, a backplane, or a radio frequency identification label.

42. The system of claim 35, further comprising a means for containing said drops at atmospheric pressure.

43. The system of claim 35, further comprising a venturi disposed between said means for applying a charge and said means for reducing a size of said drops, said venturi being configured to receive a carrier gas flow.

44. The system of claim 35, further comprising a means for selectively moving said substrate relative to said dispenser.

45. The system of claim 35, further comprising means for producing a potential, said potential being configured to accelerate said drops towards said substrate.

46. A method for depositing drops on a substrate, comprising:
dispensing drops;
imparting a charge on said drops;
reducing a size of said previously-dispensed drops before said drops reach said substrate; and
focusing said drops toward said substrate.

47. The method of claim 46, further comprising controlling a size of said drops to a range from 1 picoliter to 1 zeptoliter.

48. The method of claim 47, wherein said step of controlling a size of said drops comprises varying a charge on a plurality of electrodes as said drops having said charge pass said electrodes.

49. The method of claim 47, wherein said step of controlling a size of said drops comprises passing said drops through a filtering medium.

50. The method of claim 46, further comprising accelerating said drops toward said substrate.

51. The method of claim 50, wherein said step of accelerating said drops towards said substrate comprises accelerating said drops through a venturi.

52. The method of claim 50, wherein said step of accelerating said drops towards said substrate comprises producing a potential selected to accelerate said drops towards said substrate.

53. The method of claim 46, wherein said imparting a charge on said drops comprises inducing an electrostatic charge in said drops by passing said drops through a charged conductive screen.

54. The method of claim 46, wherein said step of focusing said drops towards said substrate comprises selectively applying a charge to a plurality of electrodes.

55. The method of claim 46, further comprising focusing a laser beam or an ultraviolet beam towards said substrate to increase adhesion of said drops onto said substrate.

56. A method for depositing drops on a substrate, comprising:
dispensing drops;
imparting a charge on said drops;
focusing said drops toward said substrate; and
processing said drops to reduce a size of said drops.

57. The method of claim 56, wherein said processing further comprises one of adjusting a nozzle of an inkjet material dispenser, performing an evaporation method on said drops, or performing a chemical reaction on said drops.

58. The method of claim 57, wherein said step of adjusting a nozzle of an inkjet material dispenser comprises one of feeding multiple nozzles with a nominal quantity of material, or reducing both a size of said nozzle and a quantity of material being emitted from said nozzle.

59. The method of claim 57, wherein said step at performing an evaporation method on said drops comprises one of applying thermal energy to said drops, applying a laser to said drops, applying ultrasound to said drops, applying ultraviolet radiation to said drops, or applying microwaves to said drops.

60. The method of claim 57, wherein said step of performing a chemical reaction on said drops comprises one of applying a reactive carrier gas to said drops, combining a plurality of chemically reactive drops, initiating a nucleation of said drops, or initiating an initial polymerization of said drops.

61. A method for depositing drops on a substrate comprising:
a step for generating drops;
a step for establishing a charge on said drops;
a step for directing said drops toward said substrate; and
a step for reducing a size of said drops before said drops are applied to said substrate.

62. The method of claim 61, further comprising a step for causing a size of said material droplets to a range from 1 picoliter to 1 zeptoliter.

63. The method of claim 61, wherein said step for reducing a size of said drops comprises:
electrostatically charging said drops; and
varying a charge on a plurality of electrostatically as said electrostatically charged drops pass said electrodes.

64. The method of claim 61, wherein said step for reducing a size of said drops comprises passing said drops through a filtering medium.

65. The method of claim 61, further comprising a step for increasing an adhesion of said drops onto said substrate.

* * * * *

UNITED STATES PATENT AND TRADEMARK OFFICE
CERTIFICATE OF CORRECTION

| | | |
|---|---|---|
| PATENT NO. | : 7,334,881 B2 | Page 1 of 1 |
| APPLICATION NO. | : 10/889810 | |
| DATED | : February 26, 2008 | |
| INVENTOR(S) | : David Punsalan et al. | |

It is certified that error appears in the above-identified patent and that said Letters Patent is hereby corrected as shown below:

In column 9, line 47, in Claim 17, after "accelerate" delete ",".

In column 9, line 52, in Claim 19, after "system" insert -- of --.

In column 9, line 53, in Claim 19, delete "trough" and insert -- through --, therefore.

In column 10, line 67, in Claim 34, after "as" delete "a".

In column 12, line 33, in Claim 59, delete "at" and insert -- of --, therefore.

In column 12, line 58, in Claim 63, delete "electrostatically" and insert -- electrodes --, therefore.

Signed and Sealed this

Second Day of March, 2010

David J. Kappos
*Director of the United States Patent and Trademark Office*